(12) United States Patent
Ma et al.

(10) Patent No.: US 9,857,899 B2
(45) Date of Patent: Jan. 2, 2018

(54) ARRAY SUBSTRATE AND DRIVE METHOD THEREOF, TOUCH CONTROL DISPLAY PANEL, AND DISPLAY APPARATUS

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Conghua Ma, Shanghai (CN); Qijun Yao, Shanghai (CN); Kang Yang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 224 days.

(21) Appl. No.: 14/832,611

(22) Filed: Aug. 21, 2015

(65) Prior Publication Data

US 2016/0291751 A1    Oct. 6, 2016

(30) Foreign Application Priority Data

Apr. 1, 2015  (CN) .......................... 2015 1 0152687

(51) Int. Cl.
   *G06F 3/041* (2006.01)
   *G06F 3/044* (2006.01)
   *H01L 27/12* (2006.01)

(52) U.S. Cl.
   CPC ............ *G06F 3/0412* (2013.01); *G06F 3/044* (2013.01); *G06F 3/0416* (2013.01); *H01L 27/124* (2013.01)

(58) Field of Classification Search
   CPC ...... G06F 3/041; G06F 3/0412; G06F 3/0416; G06F 3/044; G06F 2203/04103;
   (Continued)

(56) References Cited

U.S. PATENT DOCUMENTS

| 2006/0097991 | A1* | 5/2006 | Hotelling | ............... G06F 3/0412 345/173 |
| 2012/0105752 | A1* | 5/2012 | Park | ........................ G06F 3/044 349/33 |

(Continued)

FOREIGN PATENT DOCUMENTS

| CN | 102455536 A | 5/2012 |
| CN | 102929460 A | 2/2013 |

(Continued)

OTHER PUBLICATIONS

Chinese Application No. 201510152687.5, First Office Action dated Mar. 1, 2017.

*Primary Examiner* — Nathan Danielsen
(74) *Attorney, Agent, or Firm* — Alston & Bird LLP

(57) ABSTRACT

An array substrate and a drive method thereof, a touch control display and a display apparatus are provided. An array substrate includes, in part, a gate line layer configured with a multitude of gate lines, and a common electrode layer configured with a multitude of common electrodes. The common electrodes further operate as touch control electrodes with a projection on the array substrate along a direction substantially perpendicular to the array substrate. The projection covers n gate lines, where n is a positive integral number. At least one of the touch control electrodes comprises n sub common electrodes each having a projection on the array substrate along the direction substantially perpendicular to the array substrate covering one of the gate lines. Accordingly, less flicks or stripes appear on the display.

17 Claims, 12 Drawing Sheets

(58) Field of Classification Search
CPC .......... G06F 2203/04104; G09G 3/36–3/3696; H01L 27/12; H01L 27/1214; H01L 27/124; H01L 27/1244
See application file for complete search history.

(56) References Cited

U.S. PATENT DOCUMENTS

| | | |
|---|---|---|
| 2014/0049486 A1 | 2/2014 | Kim et al. |
| 2014/0062918 A1 | 3/2014 | Chen et al. |
| 2015/0331518 A1* | 11/2015 | Kaneko ................ G06F 3/0412 345/174 |
| 2016/0282689 A1* | 9/2016 | Zhang ................ G09G 3/3655 |

FOREIGN PATENT DOCUMENTS

| | | |
|---|---|---|
| CN | 103279237 A | 9/2013 |
| CN | 103593083 A | 2/2014 |

* cited by examiner

ARRAY SUBSTRATE AND DRIVE METHOD THEREOF, TOUCH CONTROL DISPLAY PANEL, AND DISPLAY APPARATUS

CROSS-REFERENCE TO RELATED APPLICATIONS

The present application claims priority to Chinese patent application No. 201510152687.5, filed on Apr. 1, 2015, and entitled "ARRAY SUBSTRATE AND DRIVE METHOD THEREOF, TOUCH CONTROL DISPLAY PANEL, AND DISPLAY APPARATUS", the entire disclosure of which is incorporated herein by reference.

FIELD

The present disclosure generally relates to liquid crystal displays, and more particularly, to an array substrate and a drive method thereof, a touch control display panel, and a display apparatus.

BACKGROUND OF THE INVENTION

Existing touch displays can be achieved by disposing a touch panel on a liquid crystal display panel, or integrating a touch panel with a liquid crystal display panel, with using a substrate less, and thus can be thinner. Touch displays formed by integrating the touch panels with the liquid crystal display panels can be configured as an on-cell structure or an in-cell structure. Specifically, in an in-cell structured touch display, the touch panel is embedded into liquid crystal pixels. In an on-cell structured touch display, the touch panel is disposed between a color filter substrate and a polarizing substrate.

Regarding the in-cell structured touch display, display quality thereof is one of the issues in the field of liquid crystal.

BRIEF SUMMARY OF THE INVENTION

Embodiments of the present invention include, in part, an array substrate and a method of driving the array. Embodiments of the present invention also include, in part, a touch control display panel and a display apparatus.

One embodiment of the present disclosure includes an array substrate that includes, in part, a gate line layer configured with a plurality of gate lines, and a common electrode layer configured with a plurality of common electrodes; wherein the plurality of common electrodes also serve as touch control electrodes. The touch control electrodes have a projection on the array substrate along a direction perpendicular to the array substrate, and the projection covers n gate lines. At least one of the touch control electrodes comprises n sub common electrodes, each having a projection on the array substrate along the direction perpendicular to the array substrate covering one of the gate lines, where n is a positive integral number.

According to one embodiment of the present disclosure, a drive method of an array substrate is provided. The drive method includes, in part, implementing a driving process to the gate lines on the array substrate by pulse signals; wherein high levels of the pulse signals input into the neighboring k gate lines are overlapped.

According to one embodiment of the present disclosure, a touch control display is provided. The touch control display includes any one of the array substrates recited above.

According to one embodiment of the present disclosure, a display apparatus is provided. The display apparatus includes any one of the touch control displays recited above.

In comparison with prior art, the present disclosure has following advantages.

In the array substrate provided by the present disclosure, the touch control electrodes have a projection on the array substrate along a direction perpendicular to the array substrate, and the projection covers n gate lines. Furthermore, at least one of the touch control electrodes includes n sub common electrodes, and each sub common electrode has a projection on the array substrate along the direction perpendicular to the array substrate covering one of the gate lines, where n is a positive integral number. That means one line of pixel cells corresponds to one sub common electrode, and different lines of pixel cells correspond to different sub common electrodes. In other words, sub common electrodes corresponded to different lines of pixel cells do not share a same electrode. As such, when potential on one sub common electrode corresponding to one line of pixel cells changes, potentials on the sub common electrodes corresponding to the other lines of pixel cells will not be affected. Accordingly, when gate drive signals in an overlap mode are used for driving the gate lines on the array substrate, the gate drive signal on one gate line only causes potential fluctuation of the sub common electrode corresponding to this specific one gate line, and will not affect the potentials of the sub common electrodes corresponding to the other gate lines.

Accordingly, whether the gate drive signal on one gate line is in a rising edge or a falling edge, the potentials of the common electrodes corresponding to the other gate lines will not be affected. Therefore, the array substrate provided by the present disclosure can achieved that, in each line of pixel cells, a potential difference between a pixel electrode and a common electrode is consistent with an ideal potential difference. Furthermore, regarding the n lines of pixel cells covered by the projection of each touch control electrode on the array substrate along a direction perpendicular to the array substrate, the potential differences between each pixel electrode therein and the common electrode are equal. Thus, the potential differences between the pixel electrodes and the common electrodes in any two lines of pixel cells, which correspond to two neighboring lines of touch control electrodes, are equal. Therefore, the array substrate provided by the present disclosure is able to alleviate flickers or stripes existed in prior art, thus improve the display effect.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 1:
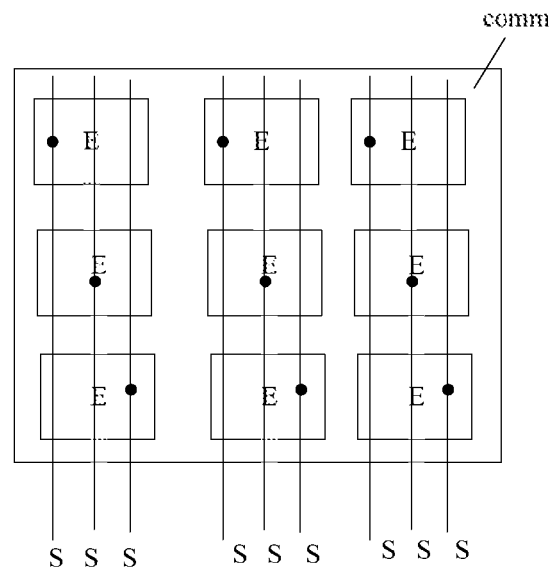
FIG. 1 is a schematic diagram of a structure of an existing array substrate.
Figure 4:
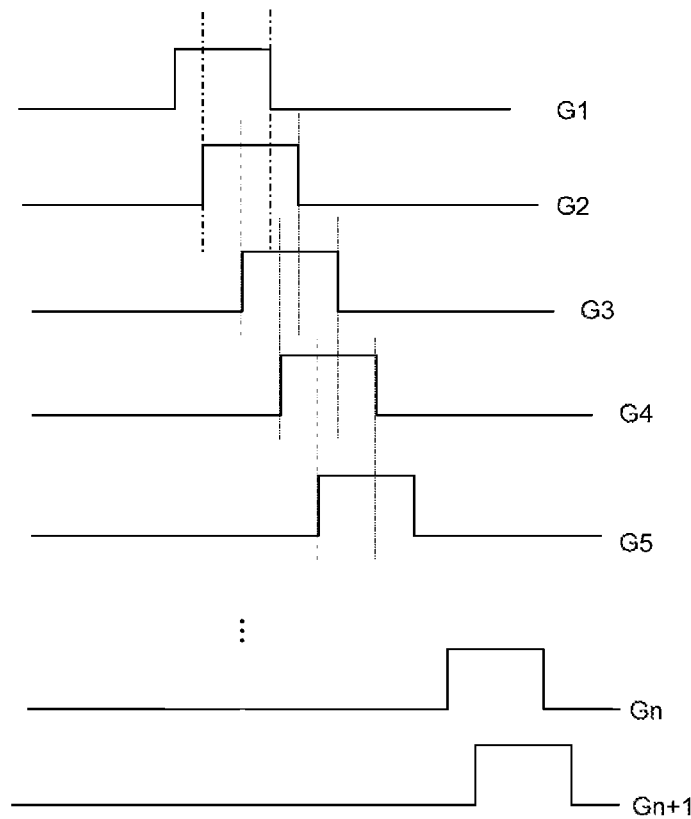
Figure 5:
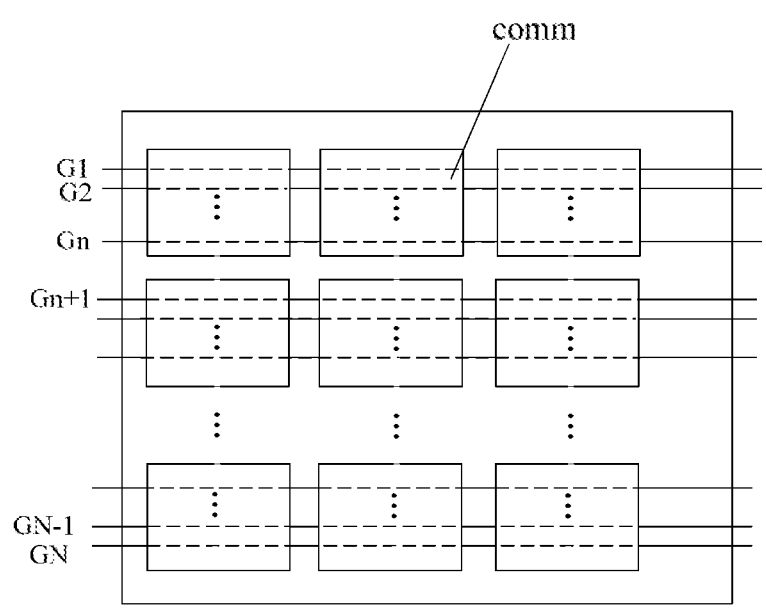
Figure 6:
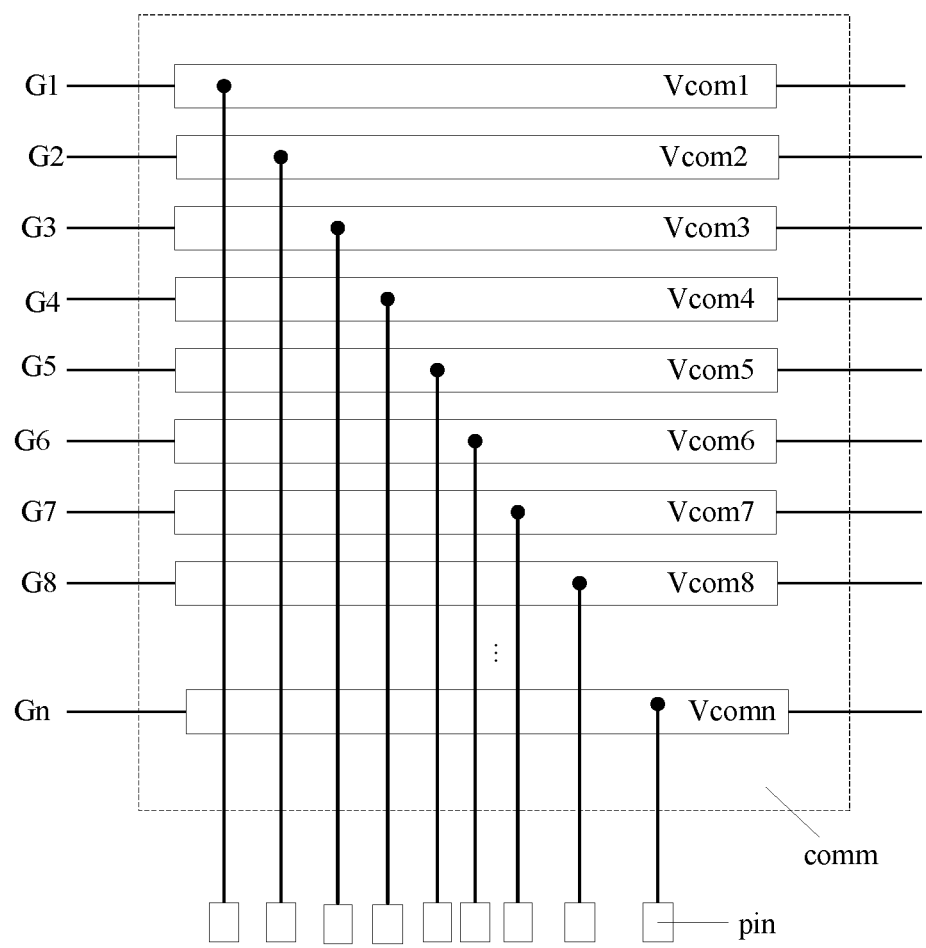
Figure 7:
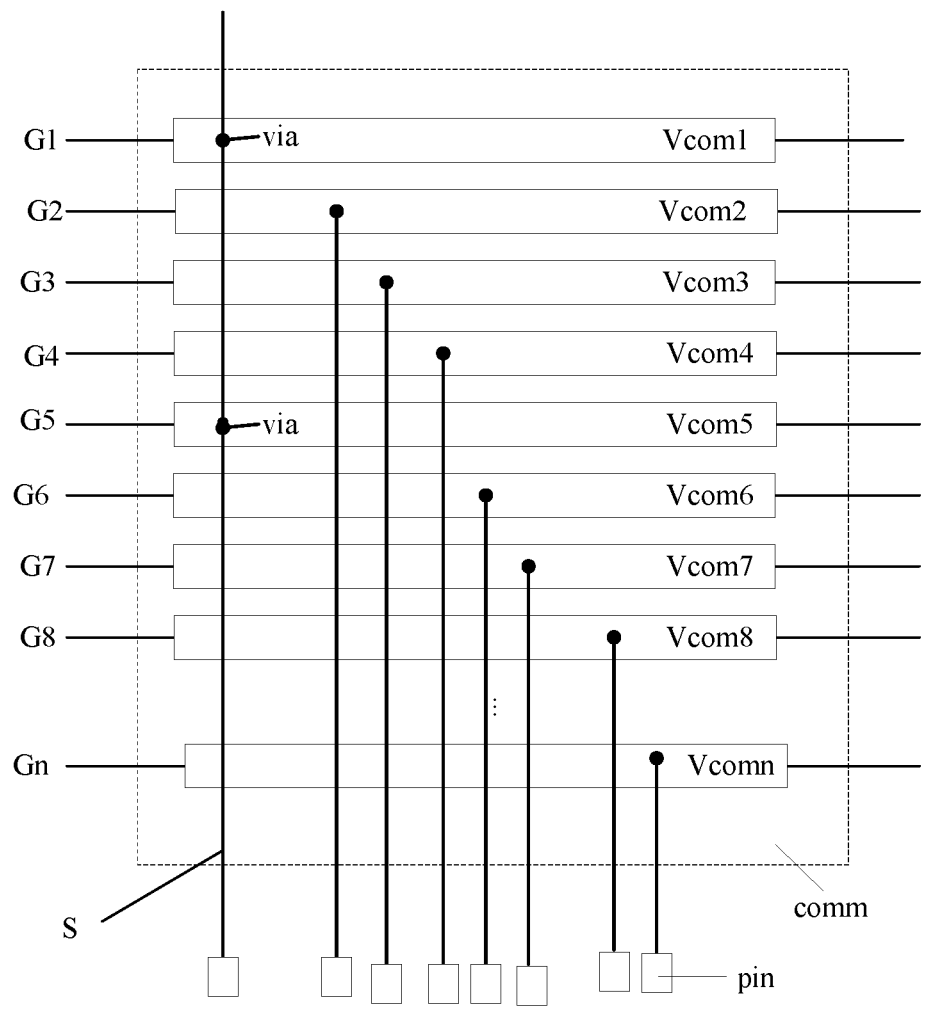
Figure 8:
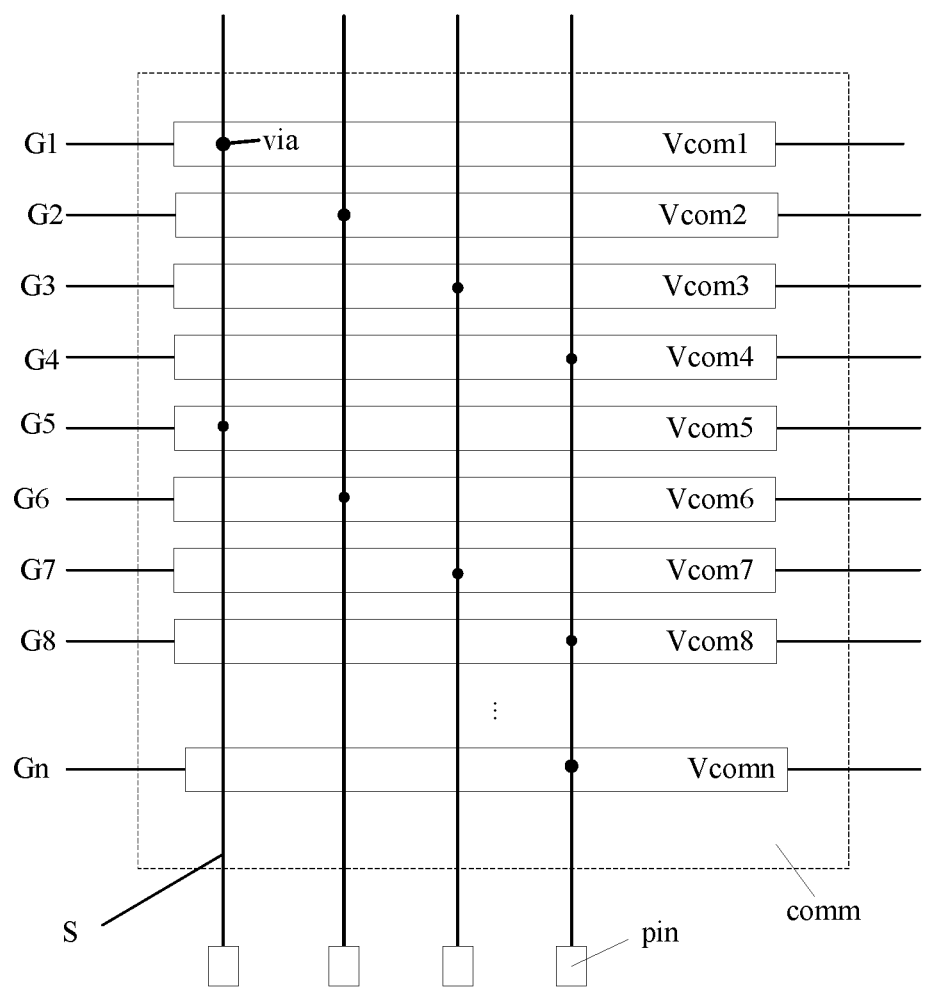
Figure 9:
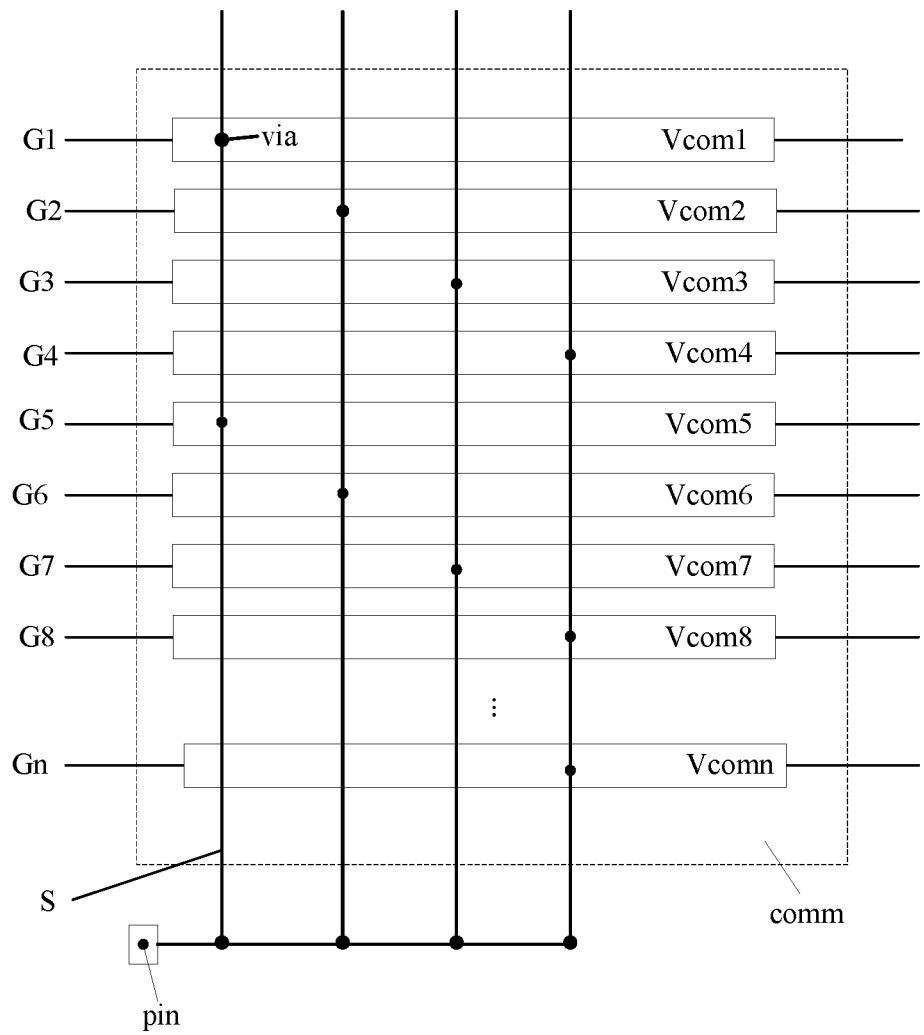
Figure 10A:
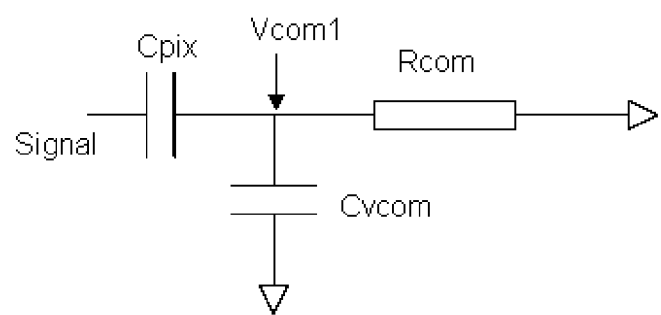
Figure 10B:
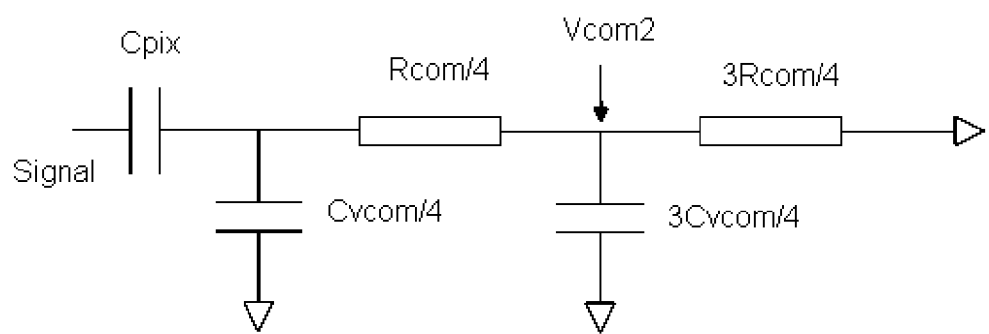
Figure 11:
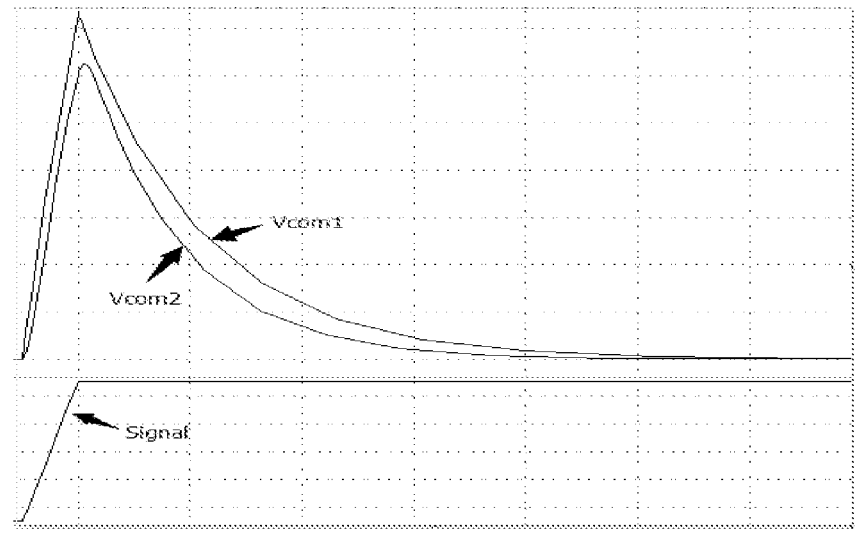
Figure 12:
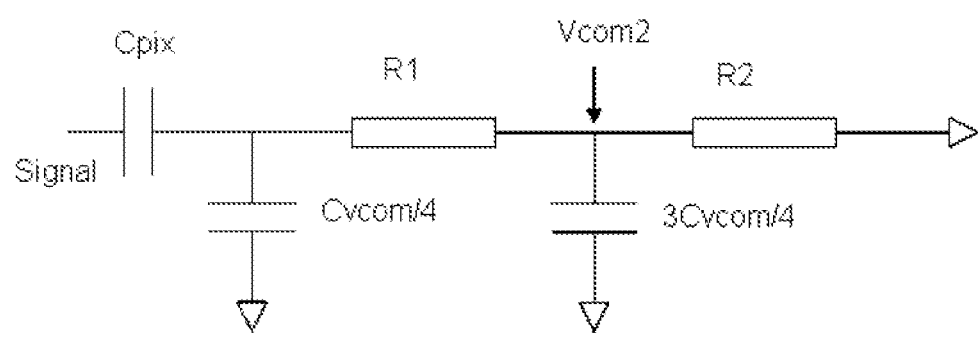
Figure 13:
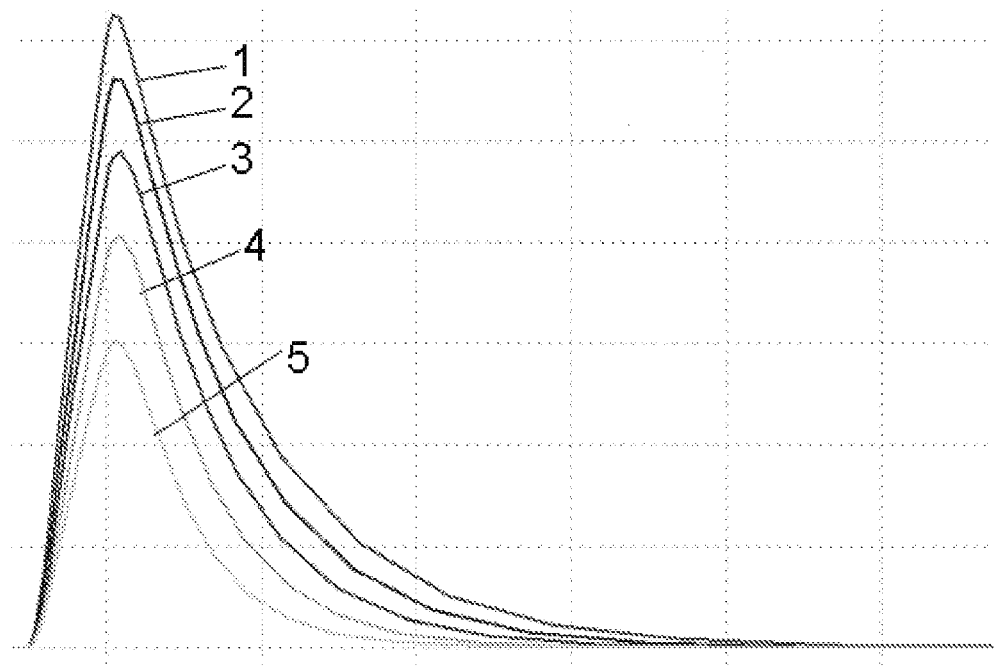
Figure 14:
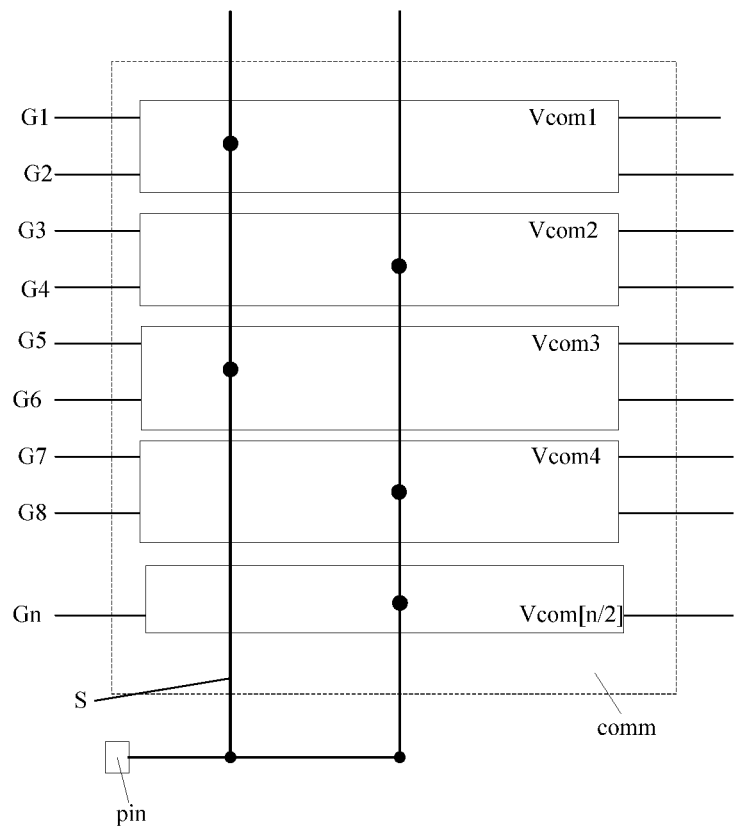
Figure 15:
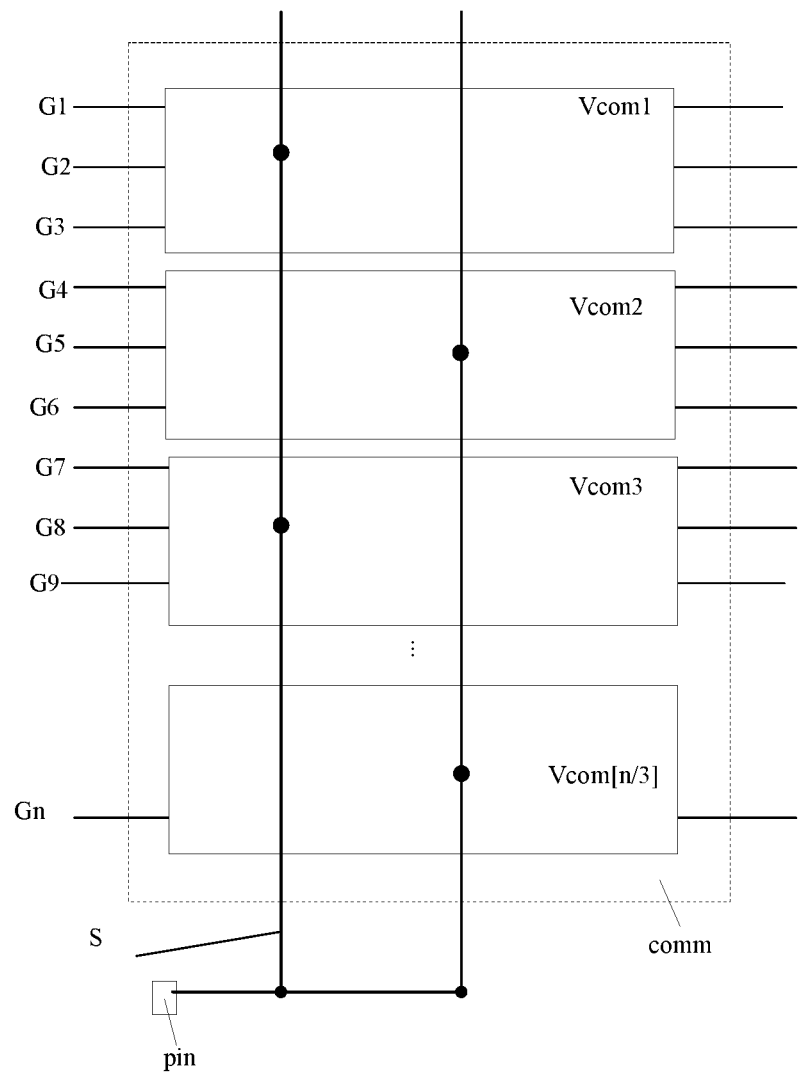
Figure 16:
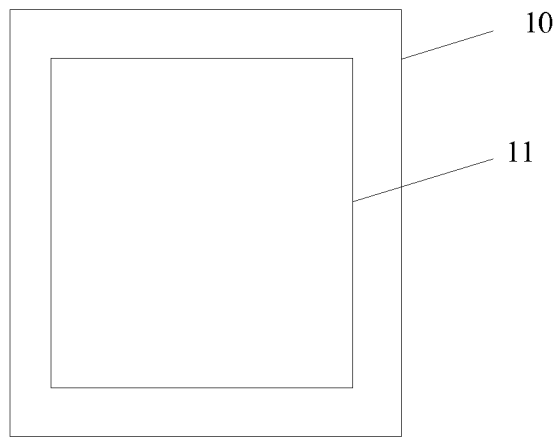
Figure 17:
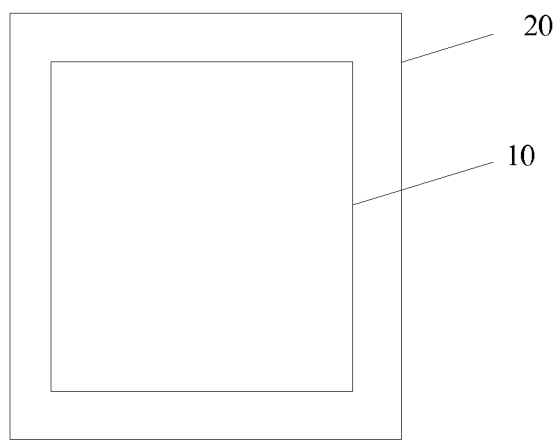

FIG. 4 schematically illustrates gate drive signals used according to one embodiment of the present disclosure;

FIG. 5 is a schematic diagram of a structure of an array substrate according to a first embodiment of the present disclosure;

FIG. 6 illustrates a structure of a touch control electrode according to the first embodiment of the present disclosure;

FIG. 7 illustrates a structure of a touch control electrode according to a second embodiment of the present disclosure;

FIG. 8 illustrates another structure of a touch control electrode according to the second embodiment of the present disclosure;

FIG. 9 illustrates a structure of a touch control electrode according to a third embodiment of the present disclosure;

FIG. 10A illustrates a simulation model of the existing touch control electrode as shown in FIG. 1;

FIG. 10B illustrates a simulation model of the touch control electrode according to the third embodiment of the present disclosure;

FIG. 11 illustrates curves obtained by entering excitation sources to the simulation models as shown in FIG. 10A and FIG. 10B;

FIG. 12 illustrates another simulation model of the touch control electrode according to the third embodiment of the present disclosure;

FIG. 13 illustrates curves obtained by entering different values of R1 to the simulation models as shown in FIG. 12;

FIG. 14 illustrates a structure of a touch control electrode according to a fourth embodiment of the present disclosure;

FIG. 15 illustrates a structure of a touch control electrode according to a fifth embodiment of the present disclosure;

FIG. 16 illustrates a structure of a touch control display panel according to one embodiment of the present disclosure; and FIG. 17 illustrates a structure of a display apparatus according to one embodiment of the present disclosure.

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

In an existing in-cell structured self capacitive array substrate, touch control electrodes are integrated into the array substrate. As shown in FIG. 1, a common electrode layer of the array substrate is configured with a plurality of electrode blocks E. Each of the plurality of electrode blocks E serves both as a common electrode and a touch control electrode. In other words, in an in-cell structured self capacitive touch control display, the common electrodes and the touch control electrodes are a common set of electrodes. Furthermore, each of the plurality of electrode blocks E is connected with a signal line S. During a display time phase of the touch control panel, a common voltage signal is input into each electrode block E; and during a touch control time phase, a touch control signal is input into each electrode block E.

Figure 2:
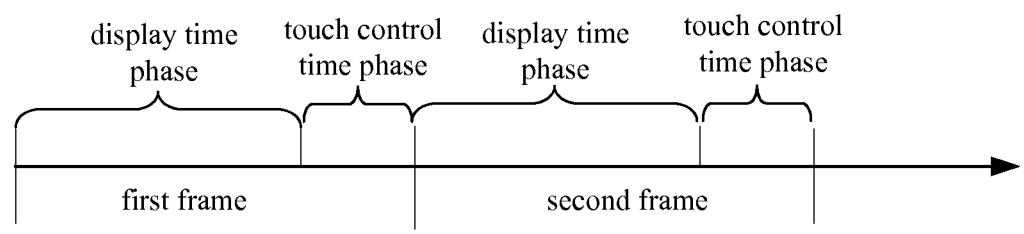
FIG. 2 illustrates a time divisional driving of display and touch control in a self capacitive in-cell structured array substrate.

In the in-cell structured self capacitive array substrate, the touch control electrodes and the common electrodes are driven by way of time divisional driving. In other words, in each frame, the display drive is implemented firstly, and then the touch control drive is implemented, as shown in FIG. 2. For example, taking 60 Hz as an example, thus each frame has 16.67 ms; wherein during the first approximately 12 ms, a common voltage signal is input into each electrode block and the display drive is implemented; and during the last approximately 4 ms, a touch control signal is input into each electrode block for touch detecting and the touch control drive is implemented.

Accordingly, when time divisional driving is applied, time for display scanning is shorten, thus effective time for charging the pixel electrodes is decreased. Therefore, in order to ensure the charging effect of the pixel electrodes, drive signals for driving each line of gates are arranged in an overlap mode, so as to pre-charge each line of gates.

However, when the overlap mode is employed for driving each line of gates, flickers or stripes may appear on images being displayed because of capacitive coupling effect.

According to deep research, the flickers or stripes appeared on the displayed images are caused by following reasons.

Figure 3:
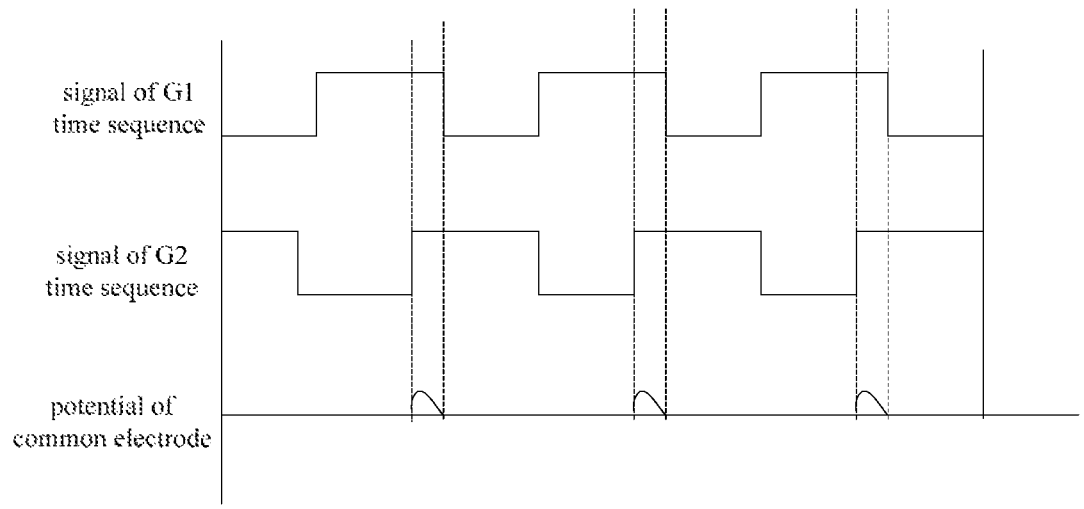
FIG. 3 is a simulation diagram of a potential change on a common electrode relating to gate drive signals.

In general, the common electrode lines are made of ITO (Indium Tin Oxide), so as to let lights passing through the touch control panel. However, the ITO has higher impedance. As a result, during the display time phase of the touch panel, regarding each line of pixel cells, a large coupling capacitance is generated between the pixel electrode and the common electrode when the gate signal is turned on or turned off. Thus, some electric charges on the pixel electrode will migrate to the common electrode, which will cause potential change on the common electrode. It will take a while for the potential of the common electrode becoming stable. According to a simulation, during this time phase, potential on the common electrode changes in a pulse manner, as shown in FIG. 3.

Regarding existing array substrates, multiple lines of pixel cells use one same common electrode. In other words, multiple lines of pixel cells corresponding to a same common electrode. Thus, when potential of the common electrode corresponding to one line of pixel cells changes, the potentials of the common electrodes corresponding to the other lines of pixel cells change as well.

Regarding any one line of pixel cells, when a gate signal on this line reaches a falling edge, this line of pixel cells will latch a potential difference between the pixel electrode and the common electrode. In this circumstance, if a gate signal on another pixel cell which uses the same common electrode is in a falling edge or a rising edge, a potential on this common electrode is unstable. Therefore, the potential difference latched by this line of pixel cells will deviate from a preset potential difference. As a result, the display effect of the display panel is poor.

In the circumstance when the overplay mode is employed by the gate signals, a coupling effect will occur between a signal on the common electrode and the gate signal in a consistent cycle manner. Assuming that, high level signals on k neighboring gate lines are overlapped, wherein k is an integral number greater than or equal to two. Referring to FIG. 4, pulse signals in an overlap mode according to one embodiment of the present disclosure are illustrated.

The array substrate includes a plurality of common electrodes which are electrically isolated from each other. Each common electrode also serves as a touch control electrode. In general, an area of the touch control electrode is larger than that of a pixel electrode. Thus, a projection of one touch control electrode on the array substrate along a direction perpendicular to the array substrate covers n lines of pixel cells, and covers n gate lines as well. These n gate lines are respectively and orderly defined as a $1^{st}$ gate line, a $2^{nd}$ gate line, . . . , and a $n^{th}$ gate line.

Regarding any two neighboring lines of touch control electrodes, such as a $i^{th}$ (i is an integral number) line of touch control electrodes and a $(i+1)^{th}$ line of touch control electrodes, in the $i^{th}$ line of touch control electrodes, the turning on or the turning off of the $k^{th}$ gate line will affect the potential difference, between the pixel electrode and the common electrode, being latched by the $1^{st}$ line of pixel cells. Similarly, the turning on or turning off of the $(k+1)^{th}$ gate line will affect the potential difference, between the pixel electrode and the common electrode, being latched by the $2^{nd}$ line of pixel cells. The turning on or turning off of the last gate line (that is, the $n^{th}$ gate line) of the $i^{th}$ line of touch control electrode will affect the potential difference, between the pixel electrode and the common electrode, that being latched by the $(n-k+1)^{th}$ line of pixel cells. However, different touch control electrodes are electrically isolated from each other, thus the turning on or turning off of the $1^{st}$ gate line in the $(i+1)^{th}$ line of touch control electrodes will not affect the common potential of the pixel cells of the $i^{th}$ line of touch control electrodes. Therefore, the potentials of the common electrodes corresponding to the $(n-k+2)^{th}$ gate line to the $n^{th}$ gate line of the $i^{th}$ line of touch control electrodes will not be affected. As a result, within the touch control electrodes in a same line, the potential difference between the pixel cell and the common electrode that being latched by the last (k−1) lines of pixel cells is different from the potential difference between the pixel cell and the common electrode that being latched by the first (n−k+1) lines of pixel cells. Therefore, flickers or stripes will appear on junction portions between two neighboring lines of touch control electrodes.

The present disclosure provides an array substrate which is adapted to solve above problems.

Referring to FIG. 5, an array substrate according to one embodiment of the present disclosure is illustrated. The array substrate includes a gate line layer and a common electrode layer. The gate line layer is configured with N gate lines which are respectively a $1^{st}$ gate line G1, a $2^{nd}$ gate line G2, . . . , and a $n^{th}$ gate lines GN, wherein N is a positive integral number. The common electrode layer is configured with a plurality of common electrodes (indicated as comm in FIG. 5). In the array substrate, the common electrodes and the touch control electrodes may be a common set of electrodes. Thus, in the array substrate, the common electrodes may also serve as the touch control electrodes of the array substrate. The touch control electrodes have a projection on the array substrate along a direction perpendicular to the array substrate, and the projection covers n gate lines. Furthermore, at least one of the touch control electrodes includes n sub common electrodes, and each sub common electrode has a projection on the array substrate along the direction perpendicular to the array substrate covering one of the gate lines. It should be noted that, n is a positive integral number and smaller than N.

In order to illustrate a structure of the array substrate clearly, a structure of one touch control electrode in the array substrate is taken as an example. This touch control electrode includes n sub common electrodes, and each sub common electrode has a projection on the array substrate along a direction perpendicular to the array substrate covering one of the gate lines.

Referring to FIG. 6, a structure of a touch control electrode in an array substrate according to a first embodiment of the present disclosure is illustrated. As shown, a projection of the touch control electrode on the array substrate along a direction perpendicular to the array substrate covers n gate lines which are respectively G1, G2, . . . , and Gn. The touch control electrode includes n sub common electrodes which are respectively Vcom1, Vcom1, . . . , and Vcomn. Each sub common electrode covers one gate line. Wherein, n is a positive integral number.

It should be noted that, a length of one gate line is generally larger than a length of one touch control electrode along a direction the gate line extends, thus the projection of the touch control electrode on the array substrate along a direction perpendicular to the array substrate covers at least a part of each of the n gate lines (that is, from G1 to Gn). The projection of each sub common electrode on the array substrate along a direction perpendicular to the array substrate covers at least a part of one of the n gate lines.

The array substrate further includes n signal-input terminals (indicated as pins, in FIG. 6), wherein each sub common electrode is connected with one of the n signal-input terminals. In some embodiments, each signal-input terminal serves both as an input terminal of a common voltage signal and an input terminal of a touch detecting signal.

During the display time phase, common voltage signals are input into the common electrodes through the n signal-input terminals, respectively. During the touch detecting time phase, touch detecting signals are input into the common electrodes through the n signal-input terminals, respectively.

It should be noted that, the n gate lines G1 to Gn, which are covered by the projection of the touch control electrode on the array substrate along a direction perpendicular to the array substrate, are driven in an order of G1, G2, G3, . . . , and Gn. The n gate lines G1 to Gn are respectively defined as a $1^{st}$ gate line, a $2^{nd}$ gate line, a $3^{rd}$ gate line, . . . , and the $n^{th}$ gate line. One sub common electrode covers one gate line refers to that, one gate line corresponds to one sub common electrode. Pixel cells corresponding to one gate line use one same sub common electrode, and pixel cells corresponding to different gate lines use different sub common electrodes. The n sub common electrodes from Vcom1 to Vcomn, which are respectively corresponded to the n gate lines from G1 to Gn, are defined as a $1^{st}$ sub common electrode Vcom1, a $2^{nd}$ sub common electrode Vcom2, a $3^{rd}$ sub common electrode Vcom3, . . . , and a $n^{th}$ sub common electrode Vcomn.

It should be noted that, as one line of pixel cells corresponds to one gate line, the projection of the touch control electrode on the array substrate along a direction perpendicular to the array substrate covers n lines of pixel cells which include n lines of pixel electrodes.

It also should be noted that, in the present disclosure, the projection of the touch control electrode on the array substrate along a direction perpendicular to the array substrate covers n gate lines, refers to, in the projection region of the touch control electrode, there are n gate lines and n lines of pixel cells.

Furthermore, in the array substrate, the touch control electrodes are arranged in an array. One line of touch control electrodes generally includes multiple touch control electrodes. Thus, in the present disclosure, the projection of each touch control electrode on the array substrate along a direction perpendicular to the array substrate covers n gate lines and n lines of pixel cells, refers to, each gate line and each line of pixel cells are partially covered rather than completely covered.

It should be noted that, a line direction of the touch control electrodes, which are arranged in an array, is parallel to a direction along which the gate lines extending. When the projection of one touch control electrode on the array substrate along a direction perpendicular to the array substrate covers n gate lines and n lines of pixel cells, the projections of the other touch control electrodes, which are located in the same line with this touch control electrode, on the array substrate along a direction perpendicular to the array substrate cover these n gate lines and n lines of pixel cells, as well. Furthermore, the sub common electrodes of the touch control electrodes located along a same line are identical.

In addition, one gate line provides a gate drive signal for one line of pixel cells. Thus, in the present disclosure, each gate line corresponds to one sub common electrode, refers to, gate lines in a same line use one sub common electrode, and gate lines in different lines use different sub common electrodes.

Accordingly, sub common electrodes corresponding to different lines of pixel cells are independent from each other. Thus, when a potential of the sub common electrode corresponding to one line of pixel cells changes, potentials of the sub common electrodes corresponding to the other lines of pixel cells will not be affected. Therefore, if the overlap mode is employed by the gate drive signals for driving the gate lines in the array substrate, the gate drive signal on one gate line only affects the potential of the sub common electrode corresponding to this specific gate line, and will not affect the potentials of the sub common electrodes corresponding to the other gate lines.

As such, whether the gate drive signal of any gate line is in the falling edge or the rising edge, the potentials of the sub common electrodes corresponding to the other gate lines will not be affected. The touch control electrode provided by the present disclosure is adapted to ensure a potential difference, between the pixel electrode and the common electrode in each line of pixel cells therein, consisting with an ideal potential difference. Furthermore, regarding the n lines of pixel cells covered by the projection of each touch control electrode on the array substrate along a direction perpendicular to the array substrate, the potential difference between the pixel electrode and the common electrode in one line of pixel cells is equal to that of any other line of pixel cells. Therefore, the touch control electrode provided by the present disclosure is able to alleviate the flickers or the stripes caused by reasons recited above, thus improve the display effect.

In addition, the common electrode of each line of pixel cells is independent, thus the touch control electrode provided by the present disclosure is adapted to make sure that, regarding any two lines of pixel cells corresponding to two neighboring lines of touch control electrodes, the potential difference between the pixel electrode and the common electrode in one line of pixel cells is equal to that of the other line. Therefore, the touch control electrode provided by the present disclosure is adapted to eliminate flickers or strips on the display screen, thus improve the display effect of the display screen.

Accordingly, the touch control electrode according to the first embodiment of the present disclosure is illustrated as above.

It should be noted that, an array substrate includes a plurality of touch control electrodes. If one of the plurality of touch control electrodes is configured into the structure as shown in FIG. 5, the flicker or the stripe phenomenon can be alleviated, thus the display effect can be improved.

It should be noted that, in an array substrate provided by the present disclosure, at least one touch control electrode is configured into the structure shown in FIG. 5. The other touch control electrodes can be configured into the structure shown in FIG. 5. Or, the other touch control electrodes can be configured into a structure different from the structure shown in FIG. 5. In some embodiments, all the touch control electrodes are configured into the structure shown in FIG. 5.

An array substrate, which includes at least one of the touch control electrode configured into the structure shown in FIG. 5, can achieve the same technique effect with one touch control electrode. Thus, in the array substrate provided by the present disclosure, potential differences between the pixel electrode and the common electrode of any two pixel cells, which correspond to two neighboring lines of touch control electrodes, are equal. Therefore, the array substrate provided by the present disclosure is able to alleviate the flickers or the stripes caused by reasons recited above, thus improve the display effect.

However, in the array substrate according to the above embodiment, there are multiple lines of pixel cells, thus corresponding to multiple gate lines and a plurality of sub common electrodes. If each of the plurality of sub common electrodes is respectively connected with an independent signal input terminal, a plurality of signal input terminals are required to be configured on the array substrate. The signal input terminal may be a terminal pin, thus a plurality of terminal pins are required to be configured on the array substrate. As a result, the wiring arrangement on the array substrate is complicated.

Accordingly, a second embodiment is provided by the present disclosure, which is adapted to reduce the number of the terminal pins configured on the array substrate, without affecting the display effect thereof.

It should be noted that, the array substrate provided by the second embodiment is a modification of the array substrate provided by the first embodiment, thus they have lots of similarities. Regarding the second embodiment, only the modifications to the first embodiment are illustrated.

Firstly, a gate drive signal input into the gate lines is illustrated.

The gate drive signal input into the gate lines is a pulse signal. The gate drive signals on k neighboring gate lines are overlapped at high levels thereof, wherein k is an integral number greater than or equal to 2. The overlap mode of the pulse signals can be configured in the manner as shown in FIG. 4.

Specifically, if the high level of the gate drive signal input into the $t^{th}$ gate line is not overlapped with the high level of the gate drive signal input into the $w^{th}$ gate line, and the high level of the gate drive signal input into the $(t-1)^{th}$ gate line is overlapped with the high level of the gate drive signal input into the $w^{th}$ gate line, then k=t−w, wherein w<t≤n, t and w are both positive integral number.

Accordingly, when the high level of the gate drive signal on the $(t-1)^{th}$ gate line is in the rising edge, the high level of the gate drive signal on the $w^{th}$ gate line is in the falling edge. Taking k=4 as an example, when the high level of the gate drive signal on the $4^{th}$ gate line is in the rising edge, the high level of the gate drive signal on the $1^{st}$ gate line is in the falling edge. It should be noted that, if a time point when the high level of the gate drive signal on one gate line reaches the rising edge, and a time point when the high level of the gate drive signal on another gate line reaches the falling edge are the same, thus the high levels of the gate drive signals on these two gate lines are referred to as being overlapped, which is also a critical time point when high levels of the gate drive signals on two different gate lines are overlapped.

Herein an overlap cycle of the gate drive signals is taken for exemplary illustration. Further, the gate drive signals correspond to from the $1^{st}$ line to the $k^{th}$ gate line.

In the overlap cycle, high levels of the gate drive signals on the $1^{st}$ line to the $k^{th}$ gate line are overlapped. As such, if the $1^{st}$ line to the $k^{th}$ gate line use a same common electrode, the gate drive signal on the $2^{nd}$ gate line will affect a potential of the common electrode on the $1^{st}$ line of pixel cells, and the gate drive signal on the $3^{rd}$ gate line will affect a potential of the common electrode on the $2^{st}$ line of pixel cells. Similarly, the gate drive signal on the $k^{th}$ gate line will affect a potential of the common electrode on the $(k-1)^{th}$ line of pixel cells. Accordingly, each gate line from the $1^{st}$ line to the $k^{th}$ line is required corresponding to different sub common electrode, respectively.

In the next overlap cycle, assuming the gate drive signals correspond to the $(k+1)^{th}$ line and the $2k^{th}$ gate line. Accordingly, when the high level of the gate drive signal on the $(k+1)^{th}$ gate line is in the rising edge, the high level of the gate drive signal on the $1^{st}$ gate line has already been turned off. In other words, when the $(k+1)^{th}$ gate line is driven by the gate drive signal, a potential difference between the pixel electrode and the common electrode thereof has been latched by the $1^{st}$ line of pixel cells. In this circumstance, even a potential of the common electrode on the $1^{st}$ line of pixel cells fluctuates, the potential difference between the pixel electrode and the common electrode has been latched by the $1^{st}$ will not be affected. Therefore, the gate drive signal on the $(k+1)^{th}$ line of pixel cells will not affect the potential difference between the pixel electrode and the common electrode that has been latched by the $1^{st}$ line of pixel cells. Similarly, the gate drive signal on the $(k+2)^{th}$ line of pixel cells will not affect the potential difference between the pixel electrode and the common electrode that has been latched by the $2^{nd}$ line of pixel cells. The gate drive signal on the $2k^{th}$ line of pixel cells will not affect the potential difference between the pixel electrode and the common electrode has been latched by the $k^{th}$ line of pixel cells. Accordingly, the sub common electrode corresponding to the $1^{st}$ gate line and the sub common electrode corresponding to the $(k+1)^{th}$ gate line can be electrically connected. The sub common electrode corresponding to the $2^{nd}$ gate line and the sub common electrode corresponding to the $(k+2)^{th}$ gate line can be electrically connected. The sub common electrode corresponding to the $3^{rd}$ gate line and the sub common electrode corresponding to the $(k+3)^{th}$ gate line can be electrically connected. And, the sub common electrode corresponding to the $k^{th}$ gate line and the sub common electrode corresponding to the $2k^{th}$ gate line can be electrically connected.

Generally speaking, the sub common electrode corresponding to the $i^{th}$ gate line and the sub common electrode corresponding to the $(i+a*k)^{th}$ gate line can be electrically connected, wherein a is an integral number.

Based on the analysis recited above, an array substrate according to one embodiment is illustrated. The array substrate is adapted to reduce the number of terminal pins configured on the array substrate without affecting the display effect thereof.

Referring to FIG. 7, a structure of a touch control electrode in the array substrate is illustrated, wherein k=4.

As shown, the projection of the touch control electrode on the array substrate along a direction perpendicular to the array substrate covers n gate lines which are G1 to Gn. The touch control electrode includes n sub common electrodes which are Vcom1 to Vcomn. Each gate line corresponds to one sub common electrode. Wherein, n is a positive integral number.

Further, the touch control electrode includes at least 4 sub common electrode sets, which are respectively defined as a $1^{st}$ common electrode sub set, a $2^{nd}$ sub common electrode set, a $3^{rd}$ sub common electrode set, and a $4^{th}$ sub common electrode set.

Regarding the $1^{st}$ sub common electrode set, a sub common electrode therein corresponds to the $r^{th}$ gate line, wherein the value of r is calculated based on Equation (1):

$$r=1+a*k=1+a*4 \qquad \text{Equation (1)}$$

where $$a \in \left\{0, 1, \ldots, \left[\frac{n}{k}\right]\right\},$$

and [n/k] indicates a value obtained by rounding down n/k.

Regarding the $2^{nd}$ sub common electrode set, a sub common electrode therein corresponds to the $r^{th}$ gate line, wherein the value of r is calculated based on Equation (2):

$$r=2+a*k=2+a*4 \qquad \text{Equation (2)}$$

where $$a \in \left\{0, 1, \ldots, \left[\frac{n}{k}\right]\right\},$$

and [n/k] indicates a value obtained by rounding down n/k.

Regarding the $3^{rd}$ sub common electrode set, a sub common electrode therein corresponds to the $r^{th}$ gate line, wherein the value of r is calculated based on Equation (3):

$$r=3+a*k=3+a*4 \qquad \text{Equation (3)}$$

where $$a \in \left\{0, 1, \ldots, \left[\frac{n}{k}\right]\right\},$$

and [n/k] indicates a value obtained by rounding down n/k.

Regarding the $4^{th}$ sub common electrode set, a sub common electrode therein corresponds to the $r^{th}$ gate line, wherein the value of r is calculated based on Equation (4):

$$r=4+a*k=4+a*4 \qquad \text{Equation (4)}$$

where $$a \in \left\{0, 1, \ldots, \left[\frac{n}{k}\right]\right\},$$

and [n/k] indicates a value obtained by rounding down n/k.

Specifically, in the $1^{st}$ sub common electrode set, the gate lines corresponding to the sub common electrodes are respectively G1, G5, G9, G13, ..., G1+4a. Accordingly, the sub common electrodes in the $1^{st}$ sub common electrode set are respectively Vcom1, Vcom5, Vcom9, Vcom13, ..., Vcom(1+4a).

In the $2^{nd}$ sub common electrode set, the gate lines corresponding to the sub common electrodes are respectively G2, G6, G10, G14, ..., G2+4a. Accordingly, the sub common electrodes in the $2^{nd}$ sub common electrode set are respectively Vcom2, Vcom6, Vcom10 Vcom14, . . . , Vcom(2+4a).

In the $3^{rd}$ sub common electrode set, the gate lines corresponding to the sub common electrodes are respectively G3, G7, G11, G15, . . . , G3+4a. Accordingly, the sub common electrodes in the $3^{rd}$ sub common electrode set are respectively Vcom3, Vcom7, Vcom11 Vcom15, Vcom(3+4a).

In the $4^{th}$ sub common electrode set, the gate lines corresponding to the sub common electrodes are respectively G4, G8, G12, G16, . . . , G4+4a. Accordingly, the sub common electrodes in the $4^{th}$ sub common electrode set are respectively Vcom4, Vcom8, Vcom12, Vcom16, Vcom(4+4a).

As shown in FIG. 7, in the touch control electrode, all the sub common electrodes in the $1^{st}$ sub common electrode set are electrically connected, thus number of terminal pins configured on the array substrate is reduced.

It should be noted that, as shown in FIG. 7, the array substrate is further configured with a signal line S. All the sub common electrodes in the $1^{st}$ sub common electrode set are adapted to be electrically connected through the signal line S. In some embodiments, the signal line S is arranged along the column direction of the array substrate. Furthermore, when a common electrode layer where the sub common electrode is located is not a same layer with a signal line layer where the signal line S is located are, a via hole (which is labeled as via in FIG. 7) is configured between the common electrode layer and the signal line layer, thus the signal line S electrically connects all the sub common electrodes in the $1^{st}$ sub common electrode set through the via hole.

Furthermore, the signal line S may be metal. The via hole configured between the common electrode layer and the signal line layer may be metal.

In the $1^{st}$ sub common electrode set, all the sub common electrodes are electrically connected, thus can be connected with one signal input terminal. In other words, each sub common electrode set only requires one terminal pin. Accordingly, in comparison with the structure of the array substrate according to the first embodiment, the array substrate according to the second embodiment requires less signal input terminals or less terminal pins on the condition of achieving identical display effect. Thus, wiring configuration on the array substrate is simplified.

It should be noted that, in the array substrate in FIG. 7, k equals to 4, which is just for exemplary illustration and should not be taken as a limitation. In practice, the value of k is not limited to 4, as long as it is an integral number not smaller than 2.

From the touch control electrode shown in FIG. 7, a method of grouping the sub common electrodes in the touch control electrode can be concluded, which is as following.

Assuming there are k sub common electrode sets in the touch control electrode, which are respectively a $1^{st}$ sub common electrode set, a $2^{nd}$ sub common electrode set, . . . , and the $k^{th}$ sub common electrode set, wherein $2 \leq k \leq n$.

Further, regarding the $i^{th}$ sub common electrode set, a sub common electrode therein corresponds to the $r^{th}$ gate line, wherein the value of r is calculated based on Equation (i):

$$r = i + a*k \qquad \text{Equation (i)}$$

where $$a \in \left\{0, 1, \ldots, \left[\frac{n}{k}\right]\right\},$$

and [n/k] indicates a value obtained by rounding down n/k.

It should be noted that, the number k of sub common electrode set is required to match with the gate drive signals input into the gate lines.

In order to further reduce the number of signal input terminals on the array substrate, all the sub common electrodes in one sub common electrode set are electrically connected, as shown in FIG. 8.

It should be noted that, the difference between the touch control electrode in FIG. 8 and that in FIG. 7 is that: in the touch control electrode shown in FIG. 8, all the sub common electrodes in each of the four sub common electrode sets are electrically connected.

Specifically, as shown in FIG. 8, regarding each of the 4 sub common electrode sets from the $1^{st}$ sub common electrode set to the $4^{th}$ sub common electrode set, all the sub common electrodes in a same sub common electrode set are electrically connected. As such, the number of the signal input terminals is four, which is equal to the number of the sub common electrode set. Therefore, a further reduced number of signal input terminals can be achieved, under the condition of achieving identical display effect with the structure according to the first embodiment.

Furthermore, as shown in FIG. 8, all the sub common electrodes in the $2^{nd}$ sub common electrode set are electrically connected through one of the signal lines S. All the sub common electrodes in the $3^{rd}$ sub common electrode set are electrically connected through one of the signal lines S. All the sub common electrodes in the $4^{th}$ sub common electrode set are electrically connected through one of the signal lines S. Similar to the structure as shown in FIG. 7, when a common electrode layer where the sub common electrodes are located and a signal line layer where the signal lines S is located are not a same layer, via holes (which is labeled as via in FIG. 8) are configured between the common electrode layer and the signal line layer, thus the signal lines S electrically connect all the sub common electrodes in the $2^{nd}$, $3^{rd}$ or the $4^{th}$ sub common electrode set through the via holes.

Furthermore, the signal lines S may be metal. The via holes configured between the common electrode layer and the signal line layer may be metal, as well.

Accordingly, an array substrate is also provided by the second embodiment. The array substrate includes an array of the touch control electrodes according to the second embodiment of the present disclosure.

In the array substrate, one touch control electrode corresponds to at least k signal input terminals. In theory, one touch control electrode is an integral structure and has one signal input terminal. That means, in the array substrate according to the second embodiment, the touch control electrode is divided into at least k sub touch control electrodes.

Furthermore, an array substrate according to a third embodiment of the present disclosure is provided, which is an integral structure and adapted to achieve improved display effect.

The array substrate according to the third embodiment is modified based on the array substrate according to the second embodiment as shown in FIG. 8. In order to emphasize differences between the third embodiment and the second embodiment of the present disclosure, regarding the third embodiment, only the differences are illustrated, and similarities there between can refer to the illustration in the second embodiment as recited above.

Referring to FIG. 9, a structure of a touch control electrode of the array substrate according to the third embodiment is illustrated. In the touch control electrode according to the third embodiment, the sub common electrode sets are connected with a common signal input terminal. As such, in the touch control electrode according to the third embodiment, one touch control electrode is connected with one signal input terminal.

An experiment is implemented to check if the touch control electrode according to the third embodiment is adapted to alleviate the flickers or the stripes.

In order to compare the touch control electrode according to prior art (e.g. the touch control electrode as shown in FIG. 1) and the touch control electrode according to the third embodiment, a simulation model of an existing touch control electrode and a simulation model of the touch control electrode according to the third embodiment are illustrated. Specifically, the simulation model of the existing touch control electrode is shown in FIG. 10A, and the simulation model of the touch control electrode according to the third embodiment are illustrated is shown in FIG. 10B.

As shown in FIG. 10A, a capacitance between a line of pixel electrodes and a common voltage Vcom is defined as Cpix, a load capacitance of the common voltage Vcom is defined as Cvcom, a resistance of a line connecting with a common electrode is defined as Rcom, and a common voltage on the existing touch control electrode is defined as Vcom1.

As shown in FIG. 10B, the load capacitance Cvcom of the common voltage Vcom is divided into two portions: ¼ Cvcom and ¾ Cvcom, and a resistance inbetween is ¼ Rcom. Further, Vcom2 refers to a common voltage on the touch control electrode according to the third embodiment of the present disclosure.

Referring to FIG. 11, two simulated waves generated when excitation sources are imposed to the simulation models as shown in FIG. 10A and FIG. 10B.

As shown in FIG. 11, the longitudinal coordinate indicates a value of the common voltage, and the horizontal coordinate indicates time. From the waves shown in FIG. 11, a time period required for Vcom2 being stabilized is shorter than that required for Vcom1 being stabilized. In other words, it is easier for Vcom2 being stabilized than that for Vcom1. Therefore, it can be concluded that the touch control electrode according to the third embodiment of the present disclosure is able to alleviate the flickers or the stripes, but not completely eliminate them.

Further, in the touch control electrode, a resistance of the signal line which connects all the sub common electrodes is defined as R1. A resistance of a signal line located outside the touch control electrode is defined as R2. And, the resistance Rcom of the line connecting with the common electrode about equals to R1 plus R2. In other words, Rcom≈R1+R2. In this case, a simulation model of the touch control electrode according to the third embodiment is as shown in FIG. 12.

Referring to FIG. 13, a simulation model of the touch control electrode according to the third embodiment when R1 is in different values is illustrated. As shown, from curve 1 to curve 5, the value of R1 increases. It can be seen, the larger the value of R1, the more stable of Vcom2. It can also be concluded that, the touch control electrode according to the third embodiment of the present disclosure is able to alleviate the flickers or the stripes, but not completely eliminate them.

In addition, flickers and stripes appeared on a display screen is caused by: the potential differences between a pixel electrode and a common electrode that being latched by pixel cells in different lines are inconsistence. Further, only when the high level of the gate drive signal corresponding to one pixel cell is in a falling edge, the pixel cell will latch the potential difference between the pixel electrode and the common electrode therein. During other time phrases, the high level of the gate drive signal is used for charging the pixel electrode, which is referred to as a charging time phase hereafter. In the charging time phrase, even the potential of the common electrode in the pixel cell fluctuates, the potential difference between the pixel electrode and the common electrode has being latched will not affected. Even the potential difference being latched is affected, the effect is smaller in comparison with the potential of the common electrode fluctuates at the time point when the pixel cell is latching the potential difference.

If the high levels of the gate drive signals on neighboring k gate lines are overlapped, regarding the neighboring k−1 gate lines, the rising edge of the high level signal on any gate line will not occur at a same time point with the falling edges of the other high level signals on the other gate lines. Further, the rising edge and the falling edge of one high level signal occurs at intervals. Therefore, regarding the neighboring k−1 gate lines, the time point when the pixel cell in any line is latching the potential difference between the pixel electrode and the common electrode will not overlap with the high level signals on the other lines of pixel cells.

Accordingly, in one overlap cycle, the neighboring k−1 gate lines are covered by the projection of one sub common electrode on the array substrate along a direction perpendicular to the array substrate. Thus, the flickers or the stripes can be alleviated as well. The high level of the gate drive signal on the other one gate line may have a substantial effect to the potential difference between the pixel electrode and the common electrode that being latched by any one of the pixel cells in the neighboring k−1 gate lines. Thus, this one gate line cannot use the same sub common electrode with the neighboring k−1 gate lines.

In order to clearly illustrate the above recited array substrate, a fourth and a fifth embodiments are provided by the present disclosure.

Referring to FIG. 14, a structure of a touch control electrode according to the fourth embodiment of the present disclosure is illustrated. In the touch control electrode, when two neighboring gate lines correspond to one sub common electrode, high levels of gate drive signals on at least three neighboring gate lines will be overlapped. Herein, we taking high levels of gate drive signals on three gate lines are overlapped for exemplary illustration.

The touch control electrode as shown in FIG. 14 is similar to that shown in FIG. 9. Thus, only the difference between the touch control electrode shown in FIG. 14 and that shown in FIG. 9 are illustrated herein.

As shown in FIG. 14, in the touch control electrode, the $1^{st}$ gate line and the $2^{nd}$ gate line use a same sub common electrode, the $3^{rd}$ gate line and the $4^{th}$ gate lines use a same sub common electrode, and the $5^{th}$ gate line and the $6^{th}$ gate line use a same sub common electrode, etc.

The gate lines are driven in an order of from G1 to Gn. Sub common electrodes corresponding the G1 to Gn are respectively: a 1st sub common electrode Vcom1, a 2nd sub common electrode Vcom2, a 3rd sub common electrode Vcom3, . . . , and $[n/2]^{th}$ sub common electrode Vcom[n/2], wherein [n/2] is rounding up of n/2.

In this circumstance, the sub common electrodes are grouped into at least two sub common electrode sets. Herein the sub common electrodes are grouped into two sub common electrode sets, which are respectively a $1^{st}$ sub common electrode set and a $2^{nd}$ sub common electrode set, for exemplary illustration.

Accordingly, in the $1^{st}$ sub common electrode set, the gate lines corresponding to the sub common electrodes are respectively the $1^{st}$ and the $2^{nd}$ lines, the $5^{th}$ and the $6^{th}$ lines, the $9^{th}$ and the $10^{th}$ lines, and so on. Accordingly, a number order of the sub common electrodes in the $1^{st}$ sub common electrode set are odd numbers, such as Vcom1, Vcom3, Vcom5, Vcom7, and so on.

In the $2^{nd}$ sub common electrode set, the gate lines corresponding to the sub common electrodes are respectively the $3^{rd}$ and the $4^{th}$ lines, the $7^{th}$ and the $8^{th}$ lines, the $11^{th}$ and the $12^{th}$ lines, and so on. Accordingly, a number order of the sub common electrodes in the $2^{nd}$ sub common electrode set are even numbers, such as Vcom2, Vcom4, Vcom6, Vcom8, and so on.

In the touch control electrode as shown in FIG. 14, sub common electrodes in one same sub common electrode set are electrically connected.

The touch control electrode according to the fourth embodiment of the present disclosure is adapted to alleviate flickers and stripes. Specifically, high levels of the gate drive signals on the three gate lines are overlapped, thus the rising edge of the gate drive signal on the $2^{nd}$ gate line will not occur at the same time with the falling edge of the gate drive signal on the $1^{st}$ gate line. Therefore, when the gate drive signal on the $2^{st}$ gate line is in the rising edge, the $1^{st}$ line of pixel cells will not latch the potential difference between the pixel electrode and the common electrode thereof. Further, when the $1^{st}$ line of pixel cells is latching the potential difference between the pixel electrode and the common electrode thereof, the voltage of the common electrode of the $1^{st}$ line of pixel cells is stable. As such, the $1^{st}$ line and the $2^{nd}$ gate line can use a same sub common electrode, and can alleviate flickers and stripes displayed as well.

However, a time point of the rising edge of the gate drive signal on the $3^{rd}$ gate line and a time point of the falling edge of the gate drive signal on the $1^{st}$ gate line may be the same or close. Therefore, the $3^{nd}$ gate line may have a substantial effect to the $1^{st}$ line of pixel electrode. As such, the $1^{st}$ and the $3^{rd}$ gate lines cannot use a same sub common electrode.

Similarly, the $4^{th}$ gate line may have a substantial effect to the $2^{nd}$ line of pixel cell, thus the $4^{th}$ and the $2^{nd}$ gate lines cannot use a same sub common electrode.

Furthermore, when the gate drive signal on the $5^{th}$ gate line is in the rising edge, the gate drive signals one the $1^{st}$ and the $2^{nd}$ gate lines have been turned off. Therefore, the $5^{th}$ gate line will not affect the $1^{st}$ and the $2^{nd}$ pixel cell. As such, the $5^{th}$ and the $1^{st}$ gate lines can use a same sub common electrode. Or, the sub common electrode corresponding to the $5^{th}$ gate line and the sub common electrode corresponding to the $1^{st}$ gate line can be electrically connected.

Similarly, the $6^{th}$ and the $2^{nd}$ gate lines can use a same sub common electrode. Or, the sub common electrode corresponding to the $6^{th}$ gate line and the sub common electrode corresponding to the $2^{nd}$ gate line can be electrically connected.

Referring to FIG. 5, a structure of a touch control electrode of an array substrate according to a fifth embodiment of the present disclosure is illustrated. In the touch control electrode, three neighboring gate lines correspond to one same sub common electrode. In this case, the high levels of the gate drive signals on at least four neighboring gate lines are overlapped. Herein, we take the high levels of the gate drive signals on four neighboring gate lines are overlapped for exemplary illustration.

The touch control electrode as shown in FIG. 15 is similar to that shown in FIG. 9. Thus, only the difference between the touch control electrode shown in FIG. 15 and that shown in FIG. 9 are illustrated herein.

As shown in FIG. 15, in the touch control electrode, the $1^{st}$ to the $3^{rd}$ gate lines use a same sub common electrode, the $4^{th}$ to the $6^{th}$ gate lines use a same sub common electrode, the $7^{th}$ to the $9^{th}$ gate lines use a same sub common electrode, the $10^{th}$ to the $12^{th}$ gate lines use a same sub common electrode, and so on.

The gate lines are driven in an order of from G1 to Gn. Sub common electrodes corresponding the G1 to Gn are respectively: a $1^{st}$ sub common electrode Vcom1, a $2^{nd}$ sub common electrode Vcom2, a $3^{rd}$ sub common electrode Vcom3, . . . , and $[n/3]^{th}$ sub common electrode Vcom[n/3], wherein [n/3] is rounding up of n/3.

In this circumstance, the sub common electrodes are grouped into at least two sub common electrode sets. Herein the sub common electrodes are grouped into two sub common electrode sets, which are respectively a $1^{st}$ sub common electrode set and a $2^{nd}$ sub common electrode set, for exemplary illustration.

Accordingly, in the $1^{st}$ sub common electrode set, the gate lines corresponding to the sub common electrodes are respectively the $1^{st}$, the $2^{nd}$ and the $3^{rd}$ lines, the $7^{th}$, the $8^{th}$, and the $9^{th}$ lines, the $13^{th}$, the $14^{th}$, and the $15^{th}$ lines, and so on. Accordingly, sequence numbers of the sub common electrodes in the $1^{st}$ sub common electrode set are odd numbers, such as Vcom1, Vcom3, Vcom5, Vcom7, and so on.

In the $2^{nd}$ sub common electrode set, the gate lines corresponding to the sub common electrodes are respectively the $4^{th}$, the $5^{th}$ and the $6^{th}$ lines, the $10^{th}$, the $11^{th}$, and the $12^{th}$ lines, the $16^{th}$, the $17^{th}$, and the $18^{th}$ lines, and so on. Accordingly, sequence numbers of the sub common electrodes in the $2^{nd}$ sub common electrode set are even numbers, such as Vcom2, Vcom4, Vcom6, Vcom8, and so on.

In the touch control electrode as shown in FIG. 15, sub common electrodes in one same sub common electrode set are electrically connected.

Based on similar analysis with the touch control electrode according to the fourth embodiment of the present disclosure, the touch control electrode according to the fifth embodiment also can alleviate flickers and stripes.

It should be noted that, regarding the array substrates according to the first to the fifth embodiment of the present disclosure, dimensions of the touch control electrodes in one array substrate are identical. In the present disclosure, the dimension of each touch control electrode is not limited. In some embodiments, dimensions of the touch control electrodes in a same column are configured in a decreasing order, for easier configurations of various lines.

Accordingly, a drive method of an array substrate is also provided by the present disclosure. The drive method implements a driving to the array substrate by pulse signals, wherein high levels of the pulse signals on k neighboring gate lines are overlapped.

In addition, a touch control display is provided by the present disclosure, as shown in FIG. 16. The touch control display 10 includes a touch control panel 11, and the touch control panel 11 can be any one of the touch control panels according to the first to the fifth embodiment of the present disclosure.

Furthermore, a display apparatus is provided by the present disclosure, as shown in FIG. 17. The display apparatus 20 includes a touch control display 10, and the touch control display 10 may be the touch control display shown in FIG. 16.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

That which is claimed:

1. An array substrate, comprising:
    a gate line layer configured with a plurality of gate lines; and
    a common electrode layer configured with a plurality of common electrodes,
    wherein the plurality of common electrodes also serves as touch control electrodes, wherein the touch control electrodes each has a projection on the array substrate along a direction perpendicular to the array substrate and the projection overlays n of the plurality of gate lines;
    wherein at least one of the touch control electrodes comprises n sub common electrodes, wherein each of the n sub common electrodes has a projection on the array substrate along the direction perpendicular to the array substrate and the projection overlays one of the plurality of gate lines, where n is a positive integral number;
    wherein the n sub common electrodes are grouped into at least k sub common electrode sets which are respectively defined as a $1^{st}$ sub common electrode set to a $k^{th}$ sub common electrode set;
    wherein k is an integral number not less than 2 and not greater than n, and wherein a value of k matches with gate drive signals input into the plurality of gate lines;
    wherein said n gate lines overlaid by the projection of said touch control electrode are respectively defined as a $1^{st}$ gate line to a $n^{th}$ gate line based on a time sequence according to which the n gate lines are driven;
    wherein regarding a $i^{th}$ sub common electrode set, if all the one or more sub common electrodes contained therein correspond to a $r^{th}$ gate line, then the value of r is calculated based on Equation (i):

$$r=i+a*k \qquad \text{Equation (i)}$$

wherein $$a \in \left\{0, 1, \ldots , \left[\frac{n}{k}\right]\right\},$$

and [n/k] indicates a value obtained by rounding down n/k; and
    wherein at least one of the sub common electrode sets has all the sub common electrodes contained therein electrically connected.

2. The array substrate of claim 1, further comprising a plurality of signal input terminals, wherein each sub common electrode is connected with one of the plurality of signal input terminals.

3. The array substrate of claim 1, wherein a high level of the gate drive signal input into a $t^{th}$ gate line and a high level of the gate drive signal input into a $w^{th}$ gate line are not overlapped, and a high level of the gate drive signal input into a $(t-1)^{th}$ gate line and the high level of the gate drive signal input into the $w^{th}$ gate line are overlapped, where k=t−w, w<t≤n, and both t and w are positive integral numbers.

4. The array substrate of claim 3, wherein within each sub common electrode set, all the sub common electrodes are electrically connected.

5. The array substrate of claim 4, further comprising k signal input terminals, wherein each sub common electrode set is electrically connected with one of the k signal input terminals.

6. The array substrate of claim 4, further comprising a signal input terminal, wherein all the sub common electrode sets are electrically connected with each other and all the sub common electrode sets are electrically connected with a common signal input terminal.

7. The array substrate of claim 3, further comprising signal lines, wherein all the sub common electrodes in a same sub common electrode set are electrically connected through the signal lines.

8. The array substrate of claim 7, further comprising metal via holes, wherein the signal lines are metal lines which are electrically connected with all the sub common electrodes in the sub common electrode sets through the metal via holes.

9. The array substrate of claim 1, wherein within each sub common electrode set, all the sub common electrodes are electrically connected.

10. The array substrate of claim 9, further comprising k signal input terminals, wherein each sub common electrode set is electrically connected with one of the k signal input terminals.

11. The array substrate of claim 9, further comprising a signal input terminal, wherein all the sub common electrode sets are electrically connected with each other and all the sub common electrode sets are electrically connected with a common signal input terminal.

12. The array substrate of claim 1, further comprising signal lines, wherein all the sub common electrodes in a same sub common electrode set are electrically connected through the signal lines.

13. The array substrate of claim 12, further comprising metal via holes, wherein the signal lines are metal lines which are electrically connected with all the sub common electrodes in the sub common electrode sets through the metal via holes.

14. The array substrate of claim 1, wherein the touch control electrodes are arranged in an array, and dimensions of the touch control electrodes that are located in a common column decrease progressively.

15. The array substrate of claim 1, configured to include a drive method, the method comprising:
    implementing a driving process to the plurality of gate lines on the array substrate by pulse signals; wherein high levels of the pulse signals input into the neighboring k gate lines are overlapped.

16. An array substrate, comprising:
    a gate line layer configured with a plurality of gate lines; and
    a common electrode layer configured with a plurality of common electrodes,
    wherein the plurality of common electrodes also serves as touch control electrodes, wherein the touch control electrodes each has a projection on the array substrate along a direction perpendicular to the array substrate and the projection overlays n of the plurality of gate lines;
    wherein at least one of the touch control electrodes comprises n sub common electrodes, wherein each of the n sub common electrodes has a projection on the array substrate along the direction perpendicular to the array substrate and wherein said projection overlays one of the plurality of gate lines, where n is a positive integral number;

wherein the sub common electrodes, which cover at most (k−1) neighboring gate lines, are electrically connected with each other, where 3≤k≤n, and k is an integral number; and wherein a high level of the gate drive signal input into a $t^{th}$ gate line and a high level of the gate drive signal input into a $w^{th}$ gate line are not overlapped, and a high level of the gate drive signal input into a $(t-1)^{th}$ gate line and the high level of the gate drive signal input into the $w^{th}$ gate line are overlapped, wherein k=t−w, w<t≤n, and both t and w are positive integral numbers.

17. A touch control display, comprising an array substrate, wherein the array substrate comprises:

a gate line layer configured with a plurality of gate lines; and a common electrode layer configured to have a plurality of common electrodes, wherein the plurality of common electrodes also serves as touch control electrodes, wherein the touch control electrodes each has a projection on the array substrate along a direction perpendicular to the array substrate and the projection overlays n of the plurality of gate lines;

wherein at least one of the touch control electrodes comprises n sub common electrodes, wherein each of the n sub common electrodes has a projection on the array substrate along the direction perpendicular to the array substrate and the projection overlays one of the gate lines, where n is a positive integral number;

wherein the n sub common electrodes are grouped into at least k sub common electrode sets which are respectively defined as a $1^{st}$ sub common electrode set to a $k^{th}$ sub common electrode set;

wherein k is an integral number not less than 2 and not greater than n, and wherein a value of k matches with gate drive signals input into the plurality of gate lines;

wherein the n gate lines overlaid by the projection of said touch control electrode are respectively defined as a $1^{st}$ gate line to a $n^{th}$ gate line based on a time sequence according to which the n gate lines are driven;

wherein regarding a $i^{th}$ sub common electrode set, if all the one or more sub common electrodes contained therein correspond to a $r^{th}$ gate line, then the value of r is calculated based on Equation (i):

$$r = i + a*k \qquad \text{Equation (i)}$$

wherein $$a \in \left\{0, 1, \ldots, \left[\frac{n}{k}\right]\right\},$$

and [n/k] indicates a value obtained by rounding down n/k; and wherein at least one of the sub common electrode sets has all the sub common electrodes contained therein electrically connected.

* * * * *